US009009707B2

(12) United States Patent
Chandrakar et al.

(10) Patent No.: US 9,009,707 B2
(45) Date of Patent: *Apr. 14, 2015

(54) SHARING RECONFIGURABLE COMPUTING DEVICES BETWEEN WORKLOADS (71) Applicant: International Business Machines Corporation, Armonk, NY (US)

(72) Inventors: Rahul Chandrakar, Bangalore (IN); Anjil R. Chinnapatlolla, Bangalore (IN); Manjunath N. Shanbhag, Kumpta (IN); Venkatesh N. Sripathirao, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/093,448

(22) Filed: Nov. 30, 2013

(65) Prior Publication Data
US 2014/0089924 A1 Mar. 27, 2014

Related U.S. Application Data (63) Continuation of application No. 13/468,084, filed on May 10, 2012.

(51) Int. Cl.
G06F 9/455 (2006.01)
G06F 9/46 (2006.01)
G06F 9/44 (2006.01)
(Continued)

(52) U.S. Cl.
CPC ............ G06F 9/45533 (2013.01); G06F 9/455 (2013.01); G06F 9/5027 (2013.01); G06F 17/50 (2013.01); G06F 2209/509 (2013.01)

(58) Field of Classification Search
None
See application file for complete search history.

(56) References Cited

U.S. PATENT DOCUMENTS 6,871,341 B1 * 3/2005 Shyr ............................. 717/131
(Continued)

FOREIGN PATENT DOCUMENTS

WO    WO2007002717    1/2007

OTHER PUBLICATIONS

Q. Wu et al., "An Architecture and Programming Framework for Dynamic Reconfigurable Computing Systems", College of Computer and Communication, Hunan University, 2006, pages.
(Continued)

Primary Examiner — Mengyao Zhe
Assistant Examiner — Bing Zhao
(74) Attorney, Agent, or Firm — Walter W. Duft (57) ABSTRACT One or more physical RCDs (PRCDs) are shared between one or more workloads in one or more virtual computing environments. Example PRCD sharing operations may include: (1) providing a virtual RCD (VRCD) for one of the workloads, the VRCD being programmed with an IC design representing a hardware implementation of a software hotspot in the workload, (2) allocating one of the PRCDs to the workload by scheduling the programmed VRCD on the PRCD, (3) burning the PRCD with the IC design of the programmed VRCD so that the PRCD becomes a programmed PRCD that is capable of implementing the workload's hotspot in hardware, and (4) invoking the programmed VRCD instead of executing the hotspot as software in order to cause the programmed PRCD to implement the hotspot in hardware.

3 Claims, 5 Drawing Sheets (51) Int. Cl.
*G06F 17/50* (2006.01)
*G06F 9/50* (2006.01)

(56) References Cited

U.S. PATENT DOCUMENTS

| | | |
|---|---|---|
| 7,020,758 B2 | 3/2006 | Fisk |
| 2007/0233727 A1 | 10/2007 | Guy et al. |
| 2011/0016473 A1 | 1/2011 | Srinivasan |
| 2011/0179132 A1 | 7/2011 | Mayo et al. |
| 2013/0205295 A1* | 8/2013 | Ebcioglu et al. .................. 718/1 |

OTHER PUBLICATIONS

F. Dittmann, "Algorithmic skeletons for the programming of reconfigurable systems", SEUS'07 Proceedings of the 5th IFIP WG 10.2 International Conference on Software Technologies for Embedded and Ubiquitous Systems, 2007, 2 pages of Abstract.

W. Chu, "Reconfigurable Computing Systems Cost/Benefit Analysis Model", 2005, 114 pages.

A. Madhavapeddy et al., "Reconfigurable Data Processing for Clouds", May 2, 2011, 5 pages.

* cited by examiner

SHARING RECONFIGURABLE COMPUTING DEVICES BETWEEN WORKLOADS

This application is a continuation under 35 U.S.C. 120 of application Ser. No. 13/468,084, filed May 10, 2012, entitled "Sharing Reconfigurable Computing Devices Between Workloads."

BACKGROUND

1. Field

The present disclosure relates to reconfigurable computing devices (RCDs) for accelerating data processing operations. More particularly, the disclosure concerns the sharing of RCDs among workloads operating in a data processing system that implements virtual computing environments.

2. Description of the Prior Art

By way of background, RCDs have been used to accelerate scalar workloads in data processing systems by removing workload operations from the software realm and implementing them in hardware. The advantage of RCDs in comparison to dedicated hardware is their ability to be reconfigured during runtime by modifying the field-programmable circuitry to handle different workload operations at different times. The present disclosure is directed to the grouping and sharing of RCDs in a virtualized computing system.

SUMMARY

A system, method and computer program product allow one or more physical RCDs (PRCDs) to be shared between one or more workloads in one or more virtual computing environments. The one or more virtual computing environments may be supported by one or more CPUs, one or more data storage resources, and the one or more PRCDs. Example operations for sharing the PRCDs may include:

(1) providing a virtual RCD (VRCD) for one of the workloads, the VRCD being programmed with an IC design representing a hardware implementation of a software hotspot in the workload;

(2) allocating one of the PRCDs to the workload by scheduling the programmed VRCD on the PRCD;

(3) burning the PRCD with the IC design of the programmed VRCD so that the PRCD becomes a programmed PRCD that is capable of implementing the workload's hotspot in hardware; and (4) invoking the programmed VRCD instead of executing the hotspot as software in order to cause the programmed PRCD to implement the hotspot in hardware.

In an embodiment, operations (1), (2) and (3) are implemented by a hypervisor that manages the virtual computing environments and operation (4) is implemented by the workload.

In an embodiment, the programmed VRCD stores the IC design as a hardware implementation file that is native to the PRCD. The IC design may comprise a device-independent register transfer level (RTL) representation of the hotspot that has been synthesized as the IC design.

In an embodiment, the PRCDs are arranged in one or more PRCD pools and the programmed VRCD is only scheduled on PRCDs in particular PRCD pools. In an embodiment, the programmed VRCD is exclusively scheduled on one of the PRCDs. In an embodiment, the programmed VRCD is scheduled with one or more other programmed VRCDs on a shared basis on one PRCD using a dynamic scheduling policy.

In another aspect, a hypervisor system, method and computer program product are provided for sharing one or more physical RCDs (PRCDs) between one or more workloads in one or more virtual computing environments supported by a system of sharable hardware resources that includes one or more CPUs, one or more data storage resources, and the one or more PRCDs. The hypervisor operations for sharing PRCDs between workloads may include:

(1) providing a virtual RCD (VRCD) for one of the workloads, the VRCD being programmed with an IC design representing a hardware implementation of a software hotspot in the workload;

(2) allocating one of the PRCDs to the workload by scheduling the programmed VRCD on the PRCD; and (3) burning the PRCD with the IC design of the programmed VRCD so that the PRCD becomes a programmed PRCD that is capable of implementing the workload's hotspot in hardware.

In an embodiment, the hypervisor operations may further include programming the VRCD with the IC design.

In another aspect, a workload system, method and computer program product are provided for utilizing one or more physical RCDs (PRCDs) that are shared between one or more workloads in one or more virtual computing environments supported by a system of sharable hardware resources that includes one or more CPUs, one or more data storage resources, and the one or more PRCDs. The workload operations for utilizing PRCDs may include:

(1) invoking a programmed virtual RCD (VRCD) instead of executing a hotspot in the workload as software in order to cause one of the PRCDs that has been programmed with an IC design representing a hardware implementation of one or more code-streams of the hotspot to implement the hotspot in hardware.

In an embodiment, the workload operations may further include identifying the hotspot as a candidate for hardware implementation in one of the PRCDs, initiating IC design processing that will generate the IC design, and modifying the hotspot to invoke the programmed VRCD.

BRIEF DESCRIPTION OF THE DRAWINGS

The foregoing and other features and advantages will be apparent from the following more particular description of an example embodiment, as illustrated in the accompanying Drawings, in which.

DETAILED DESCRIPTION OF EXAMPLE EMBODIMENTS

Figure 1:
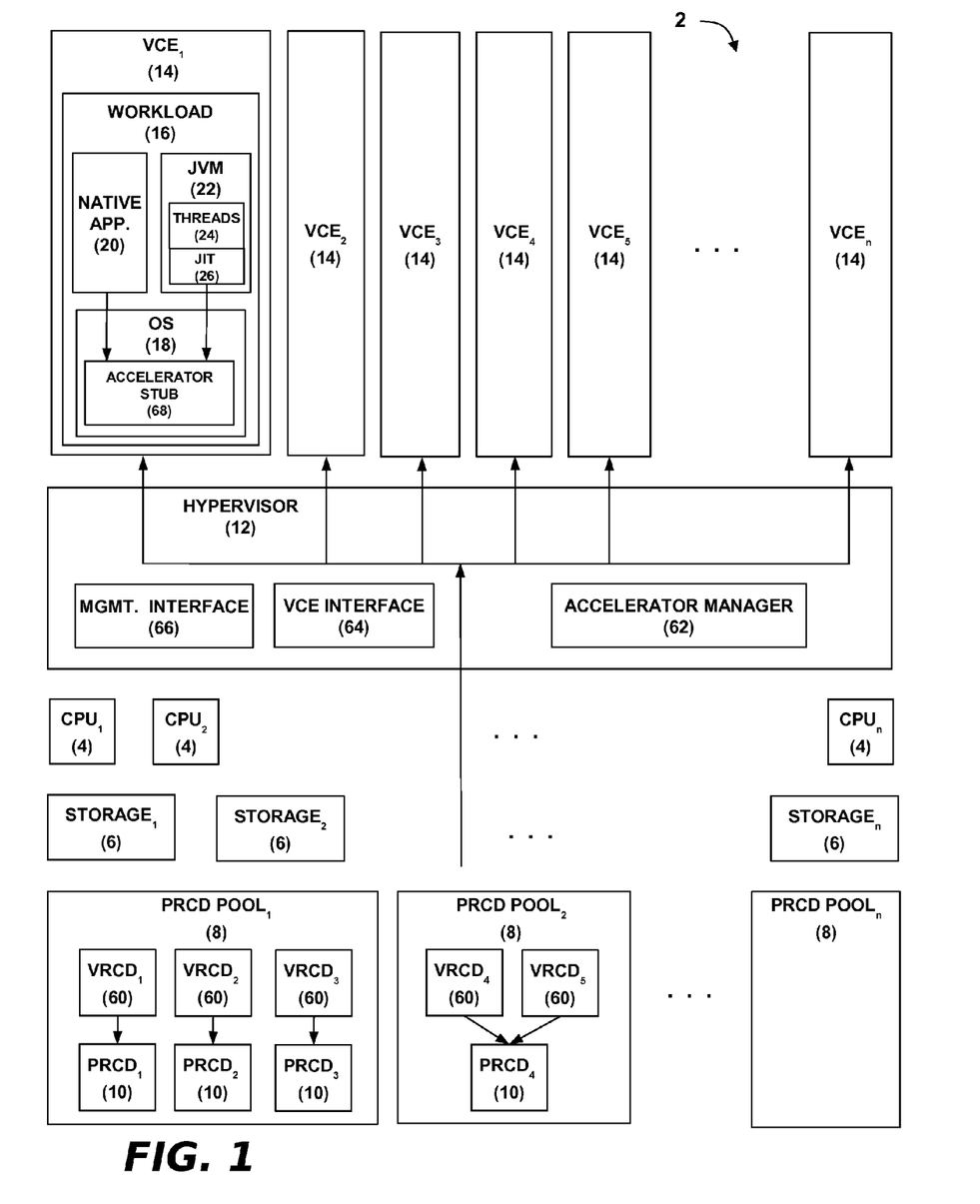
FIG. 1 is a functional block diagram showing an example computing system that may be constructed in accordance with the present disclosure.

Turning now to the drawing figures, FIG. 1 illustrates an example computing system 2 representing one possible embodiment that may be used to practice the subject matter disclosed herein. The system 2 includes a collection of sharable hardware resources that support the operation of one or more workloads in one or more virtual computing environments. The sharable hardware resources may include one or more central processing units (CPUs) 4, one or more data storage resources 6 and one or more RCDs pools 8. The RCD pools 8 shall be referred to hereinafter as physical RCD pools (PRCD pools) in order to distinguish physical RCDs from virtual RCDs (VRCDs), which are described in more detail below. In the embodiment of FIG. 1, there are "n" CPUs 4 that are respectively labeled as $CPU_1, CPU_2 \ldots CPU_n$. There are also "n" data storage resources 6 that are respectively labeled as $Storage_1, Storage_2 \ldots Storage_n$. Finally, there are "n" PRCD Pools 8 that are respectively labeled as $PRCD\ Pool_1$, $PRCD\ Pool_2 \ldots PRCD\ Pool_n$. Each PRCD Pool 8 contains one or more PRCDs 10. By way of example, $PRCD\ Pool_1$ contains three PRCDs 10 that are respectively labeled as $PRCD_1, PRCD_2$ and $PRCD_3$. Likewise, $PRCD\ Pool_2$ contains one PRCD 10 that is labeled as $PRCD_4$. As described in more detail below, the number of PRCDs 10 in each PRCD pool 8 may be changed according to operational conditions in the system 2 or other factors. Although not shown in FIG. 1, other sharable hardware resources could also be provided in the system 2, including input/output (I/O) resources, network resources, etc.

A hypervisor 12, also known as a virtual machine monitor or VMM, operates in the system 2 to provide one or more virtual computing environments (VCEs) 14 on behalf of one or more workloads 16. In the embodiment of FIG. 1, there are "n" VCEs 14 that are respectively labeled as $VCE_1, VCE_2, VCE_3, VCE_4, VCE_5 \ldots VCE_n$. Each VCE 14 contains at least one workload 16. As is known to persons skilled in the art, a conventional hypervisor or VMM is a low level software service that virtualizes the underlying hardware to provide a subset of the sharable hardware resources on behalf of each VCE instance. Except as otherwise indicated below relative to the programming and management of RCD operations, the hypervisor 12 is assumed to be conventional in nature. As such, it may be implemented according to any of the VMM design concepts that have been in use since hypervisors were first developed in the late 1960s (taking into account the VM support capabilities of the underlying hardware). Well known examples of commercial hypervisors include the CP Control Program used in the IBM VM/370® mainframe products introduced by International Business Machines Corporation in 1972, the current zVM ™ hypervisor used in the IBM System Z®/Z-Series® mainframe products, and the hypervisor used in the IBM Power Series® mid-range products. Note that reference to the foregoing commercial products is not intended to suggest that the subject matter disclosed herein is limited to mainframe or midrange computing environments. Quite the contrary, the disclosed subject matter could be implemented on any hardware platform having the ability to support virtual machine environments running concurrent workloads through the addition of appropriate hypervisor functionality. By way of example, this may include platforms based on the Intel x86 architecture.

The specific hypervisor examples mentioned above are designed to support VCE instances that each include a full operating system instance running user-level application software. This is known as platform-level virtualization, and such VCE instances are sometimes referred to as logical partitions or LPARs. The hypervisor program 12 may alternatively implement another type of virtualization known as operating system-level virtualization. Operating system-level virtualization uses a single operating system as a hypervisor to establish application-level VCEs that are sometimes referred to as application containers. Examples of operating systems that have application container support capability include the IBM AIX® 6 operating system with WPAR (Workload PARtition) support, the IBM® Meiosys virtualization products, and Linux® operating system kernels built in accordance with the OpenVZ project, the VServer project, or the Free VPS project. These operating systems have the ability to selectively allocate physical and logical resources to their VCEs. Such resource allocations may include CPUs, data storage resources, I/O (Input/Output) ports, network devices, etc.

For purposes of example only, the embodiment of FIG. 1 illustrates platform-level virtualization. As such, each workload 16 running in a VCE 14 includes an operating system (OS) 18. Each workload 16 also includes application software that is supported by the underlying OS 18. In the embodiment of FIG. 1, such application software is shown as including a native application 20 that runs directly on the OS 18 and a Java virtual machine (JVM) 22 that also runs on the OS 18 and supports one or more Java execution threads 24. The Java execution threads 24 conventionally comprise pre-compiled Java bytecode that the JVM 22 interprets and translates to machine code at runtime. The JVM 22 may further include a just-in-time (JIT) compiler 26 that conventionally caches translated hotspot code within the threads 24 so that it does not have to be repeatedly interpreted by the JVM 22 during system operations. As will be described in more detail below, the ability of the JIT compiler 26 to identify hotspot code may be used to offload such code to the PRCDs 10.

Figure 2:
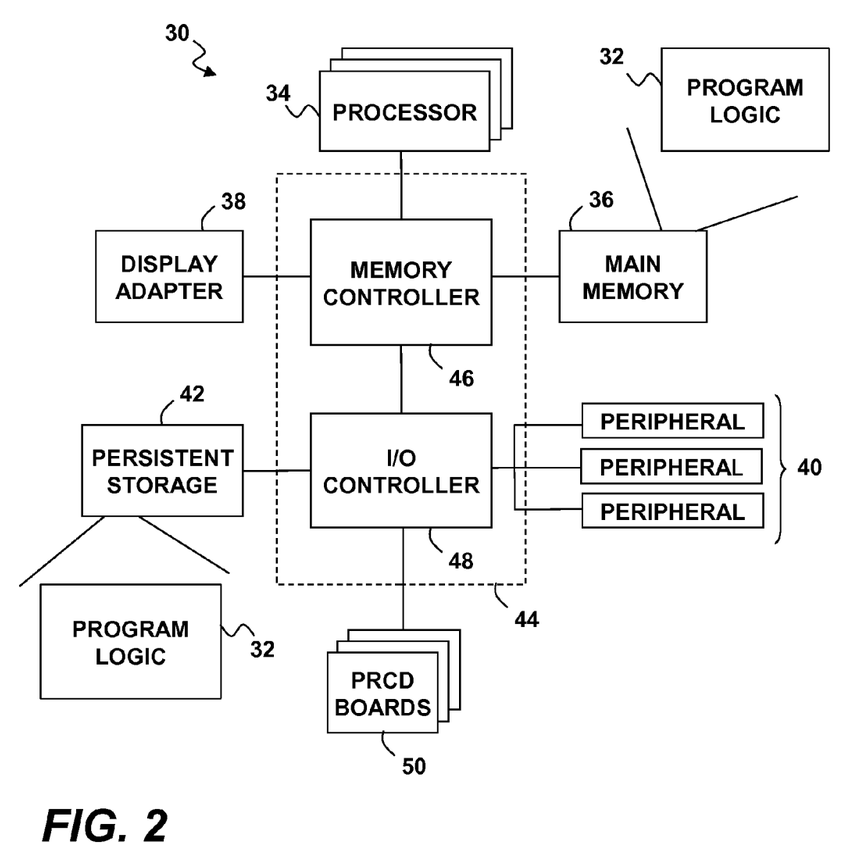
FIG. 2 is a functional block diagram showing an example machine apparatus that may be used to implement hardware and software resources of the system of FIG. 1.

Turning now to FIG. 2, an example machine apparatus 30 is shown that may be used to implement various hardware and software resources of the system 2. The apparatus 30 supports execution of the hypervisor 12 and the workloads 16 (collectively referred to as program logic 32), which respectively control the apparatus 30 to perform various operations. According to one possible embodiment, the apparatus 30 may include one or more processors 34 that operate in conjunction with a main memory 36. The processors 34 may embody the CPUs 4 of FIG. 1. For example, each processor 34 could be a single-core device, in which case the entire processor could be designated as one CPU 4. Alternatively, each processor 34 could be a multi-core device, in which case each core could be designated as one CPU 4. If the processors 34 support simultaneous multithreading (SMT), also known as hyper-threading, each hardware thread might be designated as one CPU 4. The processors 34 may comprise general purpose processors or they may be custom-designed to support special purpose operations. The memory 36 represents one species of storage device that may be provided by the data storage resources 6 of FIG. 1. The memory 36 may be implemented using any type of computer readable storage media capable of storing program instructions and data utilized by the processors 34 during instruction processing operations. Such media are typically referred to as primary storage. Examples include, but are not limited to, static or dynamic random-access memory, semiconductor read-only memory, or combinations thereof. The processors 34 and the memory 36 may be situated within a single computing node (e.g., as part of a single-node SMP system) or they may be distributed over plural nodes (e.g., as in a distributed NUMA system, a cluster, a cloud, etc.). Other distributed topologies could also be employed. Although not shown, conventional cache memories may be respectively associated with the processors 34 to buffer the program logic 32 and associated program data stored in the main memory 36.

Additional components of the apparatus 30 may include a display adapter 38 (e.g., a graphics card) for generating visual output information (e.g., text and/or graphics) to a display device (not shown), and various peripheral devices 40 that may include a keyboard or keypad input device, a pointer input device, a network interface card (NIC), a USB bus controller, a SCSI disk controller, etc. A persistent storage device 42 may also be provided. The persistent storage device 42 represents another species of storage device that may be provided by the data storage resources 6 of FIG. 1. It may be implemented using many different types of data storage hardware, including but not limited to magnetic or optical disk storage, solid state drive storage, flash drive storage, tape backup storage, or combinations thereof. A bus or other communications infrastructure 44, which may include a memory controller hub or chip 46 (e.g., a northbridge) and an I/O (input/output) controller hub or chip 48 (e.g., a southbridge), may be used to interconnect the foregoing elements. A set of one or more PRCD boards 50 may also be provided in the apparatus 30, such as by operatively connecting them to the I/O controller 48. Each PRCD board 50 may provide one or more of the PRCDs 10 of FIG. 1. It should be understood that the foregoing description is for purposes of illustration only, and that other components and arrangements may also be used to configure the apparatus 30.

The apparatus 30 may be implemented as a client or server machine. In either case, the program logic 32 may be implemented in software, firmware or a combination thereof, and possibly with some operations being performed by dedicated hardware logic. If implemented in software, the program logic 32 may be loaded from the persistent storage 42 into a portion of the main memory 36 that comprises RAM. If implemented in firmware, the program logic 32 could reside in a portion of the main memory 36 that comprises ROM, such as EPROM memory. The program logic 32 may comprise a collection of program instructions, possibly having entry and exit points, written in a suitable programming language. Such programming languages may include, but are not limited to, a high level procedural language such as C, a high level object oriented language such as C++, an interpreted language such as Java, BASIC, Perl, Python, or a lower level language such as assembly. The program instructions written in such languages may be compiled and/or interpreted and/or assembled (as the case may be) into machine language program instructions that are capable of execution on the processors 34. When the machine language program instructions are loaded into and executed by the processors 34, the resultant programmed apparatus 30 becomes a particular machine for practicing the subject matter described herein. The program instructions of the program logic 32 may be embodied in one or more modules, each of which may be compiled and linked into an executable program, installed in a dynamically linked library, or otherwise made ready for invocation and execution by the apparatus 30. The module(s) may be implemented to run with or without the support of an underlying operating system. They may be callable from other modules or from themselves, and/or may be invoked in response to detected events or interrupts.

As mentioned, some aspects of the program logic 32 could be implemented using dedicated logic hardware. Examples of such hardware would include connected logic units such as gates and flip-flops, and/or integrated devices, such as application specific integrated circuits (ASICs). The PRCD boards 50 also represent hardware logic devices, but are field-programmable so that their logic configuration can be changed during runtime according to the requirements of the workloads 16. In an example embodiment, the PRCD boards 50 may comprise field programmable gate arrays (FPGAs)), reconfigurable data path arrays (rDPAs) or other reconfigurable computing devices. The design, construction and operation of such devices is well known in the art, and in the interest of brevity will not be described further herein.

Returning now to FIG. 1, the workloads 14 in the system 2 may normally implement their data processing operations as software instructions that are executed on the CPUs 4. These software instructions, and the data on which they operate, are stored on the data storage resources 6. As discussed in the Background section above, there are times when software execution of workload functions entails processing that is computationally intensive, such that data processing throughput would benefit from offloading such work from the CPUs 4 and having it performed by the PRCDs 10. Such workload functions are known as "hotspots." One known type of computationally intensive hotspot processing comprises algorithms that execute repetitively over an inordinate number of iterations, but reference only a predictable limited range of memory. An example would be a large Montecarlo simulation, such as might be used for risk analysis in the field of financing and banking In that case, a base simulation algorithm might be executed repetitively over a million times to determine a final result. Pseudocode Example 1 below exemplifies this type of algorithm.

Pseudocode Example 1

```
NUM_OF_SIMULATIONS = 1000000;
for (int i=0; i<NUM_OF_SIMULATIONS; i++ {
    /*Typical compute intensive algorithm*/
}
```

Figure 3:
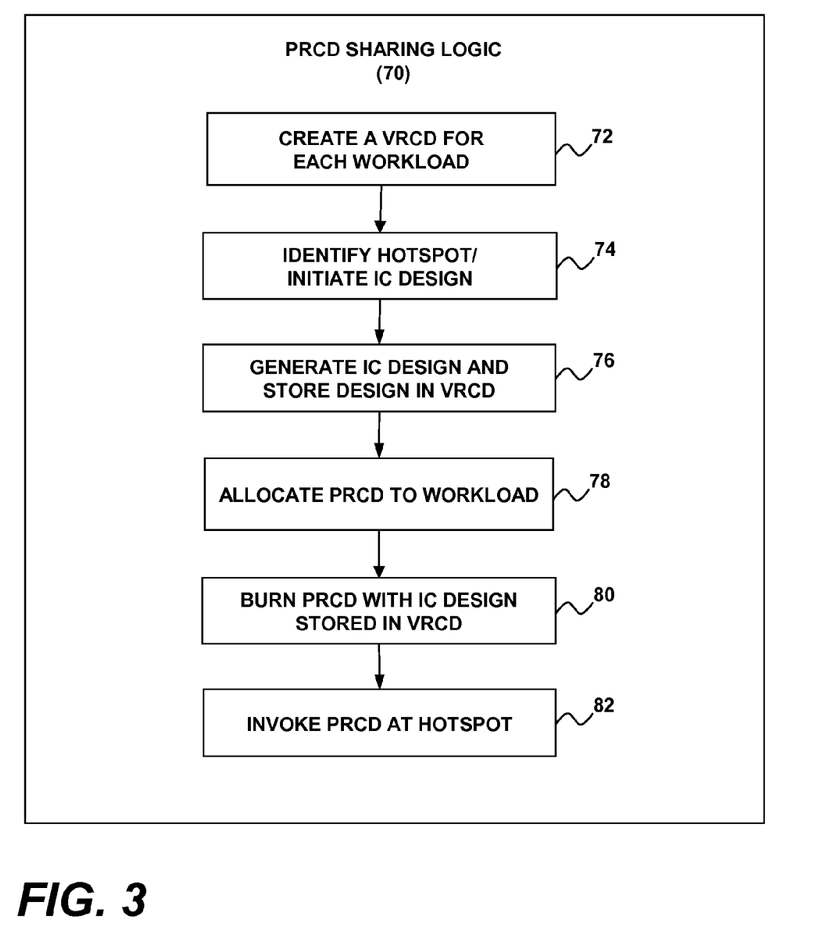
FIG. 3 is a flow diagram showing example PRCD sharing logic that may be implemented by the system of FIG. 1.

Identifying such hotspot work and offloading it to the PRCDs 10 on behalf of each of the workloads 16 in the system 2 may be handled using the machine-implemented operations shown in FIG. 3. These operations can be collectively performed by the hypervisor 12 and the workloads 16 themselves working in cooperation with each other. In the discussion of FIG. 3 below, reference will be made to several additional components in FIG. 1 that have not been identified thus far. As can be seen in FIG. 1, these additional components comprise a set of virtual RCDs (VRCDs) 60 that are assigned to the workloads 16, a PRCD accelerator manager 62, a VCE interface 64 and a management interface 66 within the hypervisor 12, and an accelerator stub API 68 within each workload OS 18.

Returning now to FIG. 3, the illustrated operations are collectively referred to as PRCD sharing logic 70. As indicated above, the logic 70 includes operations that may be collectively performed by the hypervisor 12 and the workloads 16. Following the discussion of FIG. 3 below, FIGS. 4 and 5 will be described to illustrate the particular operations that may be performed individually by the hypervisor 12 and the workloads 16.

In FIG. 3, the accelerator manager 62 within the hypervisor 12 initially performs operational block 72 in which it creates one or more one or more of the VRCDS 60 for each of the workloads 16. In an example embodiment, the VRCD creation operation may be initiated by a human administrator interacting with the management interface 66 (which may be implemented as a GUI). In another embodiment, the VRCD creation operation might be performed without human intervention. VRCD creation may be performed at any time during the life of a VCE 14. For example, a VCE 14 could be given one or more VRCDs 60 when the VCE is first created. The same VCE 14 could also be given additional VRCDs 60 if a workload 16 therein subsequently required additional VRCDs. In order to support the latter scenario, the workload 16 may be programmed to alert the administrator of the need for an additional VRCD 60. One way that the workload 16 could do this is by interacting with the accelerator manager 62 via the hypervisor's VCE interface 64 (which may be implemented as an API). The accelerator manager 62 could then pass the VRCD request to the administrator via the management interface 66. Alternatively, the accelerator manager 62 may be programmed to automatically create a new VRCD 60 in response to the workload's request, without administrator involvement.

In the embodiment of FIG. 1, one VRCD 60 is shown for each workload 16 in $VCE_1$-$VCE_5$, namely $VRCD_1$, $VRCD_2$, $VRCD_3$, $VRCD_4$ and $VRCD_5$. The VRCDs 60 are device-independent entities that may be implemented in various ways. For example, each VRCD 60 could be embodied as a memory region maintained by the hypervisor 12 on one of the storage devices 60 in order to hold an integrated circuit (IC) synthesis file that may be used for PRCD "burning" (described in more detail below). Initially, a VRCD 60 need not contain any IC synthesis data, but can be "programmed" at any time to add such data as hotspots in the workloads 16 are identified and synthesized. The memory region for each VRCD 60 may be shared with the workload 16 for which the VRCD was created. As described in more detail below, when a workload 16 needs to utilize a PRCD 10 for hotspot processing, it does so through one of its VRCDs 60. When this occurs, it is the job of the hypervisor 12 to allocate an actual PRCD 10 to the workload 10. The hypervisor 12 thus virtualizes the PRCDs in much the same way that it virtualizes the CPUs 4, the storage devices 6, and other hardware resources.

If the PRCDs are grouped into PRCD pools 8, as in the embodiment of FIG. 1, the VRCD creation operation may include assigning each new VRCD 60 to a specific PRCD pool. PRCD pooling establishes boundaries on the number of PRCDs 10 to which a given workload 16 can be allocated. For example, because $VRCD_1$, $VRCD_2$ and $VRCD_3$ are assigned to $PRCD POOL_1$, these VRCDs will only be allocated to $PRCD_1$, $PRCD_2$ and $PRCD_3$, not $PRCD_4$. Similarly, because $VRCD_4$ and $VRCD_5$ are assigned to PRCD $Pool_2$, these VRCDs will only be allocated to $PRCD_4$, not to $PRCD_1$, $PRCD_2$ or $PRCD_3$. In this way, each VRCD 60 will be backed by a particular PRCD pool 8 that represents a bounded set of PRCDs 10 that are available to the VRCD, allowing an administrator to better control the manner in which workloads are allowed to use the PRCDs to offload hotspot processing. It will be appreciated that administrators may be empowered to move both VRCDs and PRCDs between and among the various PRCD pools 8, such that the membership of each PRCD pool may be redefined as desired to ensure efficient system operation. For example, a capability for PRCD pools 8 to be edited, added, removed, divided, consolidated, etc., may be provided.

In operational block 74, software hotspots that are candidates for hardware implementation are identified and the IC design process is initiated. Hotspots may be identified either manually or automatically at runtime. For example, a human programmer or administrator may determine that a particular portion of a workload's operations represent a hotspot. In that case, the programmer or administrator could initiate the IC design process to create a corresponding IC design. As described in more detail below in connection with operational block 76, this will result in a VRCD 60 being programmed with the IC design to become a programmed VRCD. The application containing the hotspot, such as the native application 20 of FIG. 1, may then be reprogrammed, instrumented or otherwise modified so that the code-streams representing the hotspot are bypassed and their operations are offloaded for hardware implementation in a PRCD 10. Hotspot modification and PRCD invocation are described in more detail below in connection with operational block 82.

Automated hotspot identification may be performed within the context of existing software code optimizing techniques, such as just-in-time (JIT), dynamic binary optimization (DBO), etc. These conventional optimizing techniques provide hotspot identification capabilities that can be leveraged to identify hotspot code streams that are candidates for hardware implementation using the PRCDs 10. Automated hotspot identification may be conveniently performed by processing within the workload 16. In the embodiment of FIG. 1, the JIT compiler 26 may be used to perform this function with respect to the indirectly executable bytecode of the Java threads 24. However, instead of caching a translated section of hotspot code in the usual manner, the JIT compiler 26 can be programmed to identify hotspot code streams that are candidates for hardware implementation, and then initiate the IC design process by specifying the hotspot code stream(s) to the hypervisor 12 via the VCE interface 64. The hotspot code stream(s) may be specified by the workload 16 to the hypervisor 12 in any suitable manner. Although not shown, a DBO program could perform similar processing (e.g., at load time, runtime, etc.) with respect to the native application's directly executable code. It would also be possible to perform hotspot identification within the hypervisor 12, such as by programming the hypervisor to observe workload processing and perform DBO operations thereon.

In operational block 76, the code stream(s) representing a workload's identified software hotspot is/are used to generate an integrated circuit (IC) design that is stored in a VRCD 60 created for the workload. The IC design operation may be performed manually or automatically. A manual approach would typically be used when a manual process is also used to identify software hotspots. In an automated approach, the accelerator manager 62 in the hypervisor 12 could generate the IC design in response to the workload 16 specifying the hotspot code stream(s) via the VCE interface 64. The IC design may be created using a two-step process that includes (1) generating a device-independent RTL (register transfer level) representation of the hotspot code stream(s), and (2) synthesizing the RTL representation as a hardware implementation file that is native to the PRCD component configuration. In an example embodiment, the creation of an RTL representation per operation (1) may be performed using a conventional hardware description language, such as VHDL or Verilog. In an example embodiment, the synthesis of the RTL representation per operation (2) may be performed using conventional IC design and synthesis tools, such as an RTL compiler and an FPGA placement and routing program (both of which might be provided by the PRCD vendor). The result of operations (1) and (2) will be a completed hardware design that is mapped to the physical PRCD components and is ready for burning (see operational block 80, described in more detail below). Once the IC design is complete, a VRCD 60 associated with the workload is selected and used to store the resultant hardware implementation file, such that the VRCD becomes a programmed VRCD.

In operational block 78, the accelerator manager 62 in the hypervisor 12 allocates a PRCD 10 to the workload associated with the programmed VRCD 60. This is a VRCD scheduling operation that may be performed with or without administrator input. The scheduling of a VRCD 60 on a PRCD 10 may represent a permanent allocation (static scheduling) or a temporary allocation (dynamic scheduling). The type of allocation used in any particular system will depend on various factors, such as the total number of PRCDs 10 versus the number of workloads 16 that require PRCDs, the level of PRCD support that each workload will need, the relative importance of the tasks performed by the workloads 16, etc.

By way of example, FIG. 1 shows three PRCDs 10 and three VRCDs 60 in PRCD Pooh. Insofar as there is an equal number of PRCDs and VRCDs, each VRCD may be statically scheduled to have exclusive ownership of an entire PRCD. In particular, $VRCD_1$ exclusively owns $PRCD_1$, and $VRCD_2$ exclusively owns $PRCD_2$, and $VRCD_3$ exclusively owns $PRCD_3$. Because $VRCD_1$, $VRCD_2$ and $VRCD_3$ are respectively assigned to the workloads 16 of $VCE_1$, $VCE_2$ and $VCE_3$, $PRCD_1$, $PRCD_2$ and $PRCD_3$ may be thought of as being permanently allocated to these workloads, respectively, on a dedicated basis. It will be appreciated that the situation depicted in PRCD Pooh would change if additional VRCDs 60 were added to that pool without increasing the number of PRCDs 10. In that case, there would be more VRCDs 60 than there are PRCDs 10, which would require the implementation of a temporary scheduling algorithm wherein some of the VRCDs can only be temporarily scheduled on the PRCDs.

PRCD $Pool_2$ illustrates this situation in FIG. 1. In PRCD $Pool_2$, there is one PRCD 10 and two VRCDs 60. Insofar as there is an unequal number of PRCDs 10 and VRCDs 60, neither VRCD may be statically scheduled to run on its own PRCD. Instead, $VRCD_4$ and $VRCD_5$ must share $PRCD_4$. Because $VRCD_4$ and $VRCD_5$ are assigned to separate workloads (i.e., the workloads 16 associated with $VCE_4$ and $VCE_5$), these workloads may only be temporarily allocated to $PRCD_4$. In order to facilitate such PRCD sharing, the accelerator manager 62 may implement a dynamic scheduling policy that allows each of the workloads 16 associated with $VRCD_4$ and $VRCD_5$ to have access to $PRCD_4$. Any suitable dynamic scheduling policy may be used. Examples include a standard time-division multiplexing policy wherein each workload 16 receives equal PRCD time slices, or a priority-based multiplexing policy wherein the workloads receive different amounts of PRCD time according to their relative priority. In the case of priority-based scheduling, the scheduling policy may implement a fixed scheduling model wherein the workload priorities are fixed (e.g., by an administrator) and the PRCD sharing ratio does not change. Alternatively, a variable scheduling model could implemented wherein the PRCD sharing ratio changes according to changes in relative workload priorities due to operational conditions in the system 2 or other factors.

When a VRCD 60 is ready to run on a PRCD 10, operational block 80 may be implemented to burn the PRCD with the IC design stored by the VRCD, such that the PRCD becomes a programmed PRCD. This operation may performed by the accelerator manager 62 in the hypervisor 12 using a conventional RCD programming technique (such as an FPGA programming operation) that configures the target PRCD 10 according to the IC design. In an example embodiment, the accelerator manager 62 could notify the workload 16 when the programmed PRCD 10 is ready for use, such as by indicating that the associated VRCD 60 is operational. However, the workload 16 does not necessarily need to know this information. Insofar as the workloads 16 interact with their respective VRCD(s) 60 rather than the underlying PRCDs 10, any given workload merely needs to know that a particular VRCD has been programmed with an IC design. The workload 16 may then invoke the programmed VRCD 60 (see operational block 82 below) and allow the hypervisor 12 to handle the VRCD/PRCD scheduling.

In operational block 82, the workload hotspot whose IC design has been burned to a PRCD 60 is modified to invoke the corresponding VRCD 60 (instead of running the original hotspot code-stream(s) as software on one of the CPUs 4). In FIG. 1, the accelerator stub 68 in the workload OS 18 illustrates one example technique that a workload 16 may use to invoke a VRCD 60. The accelerator stub 68 provides an API that may be invoked by workload applications, such as the native application 20 and the JVM 22, when a hardware-implemented hotspot region is reached, thereby bypassing the original hotspot code stream(s). The accelerator stub API may be invoked by a workload application in any suitable manner, such as by using a system call that identifies the programmed VRCD 60 to be invoked and a memory area where the hotspot data to be manipulated by the PRCD hardware circuitry is located. This operation may be analogized to a CUDA (Compute Unified Device Architecture) application offloading certain operations for GPGPU (General-Purpose Computing on a Graphics Processing Unit) processing.

Figure 4:
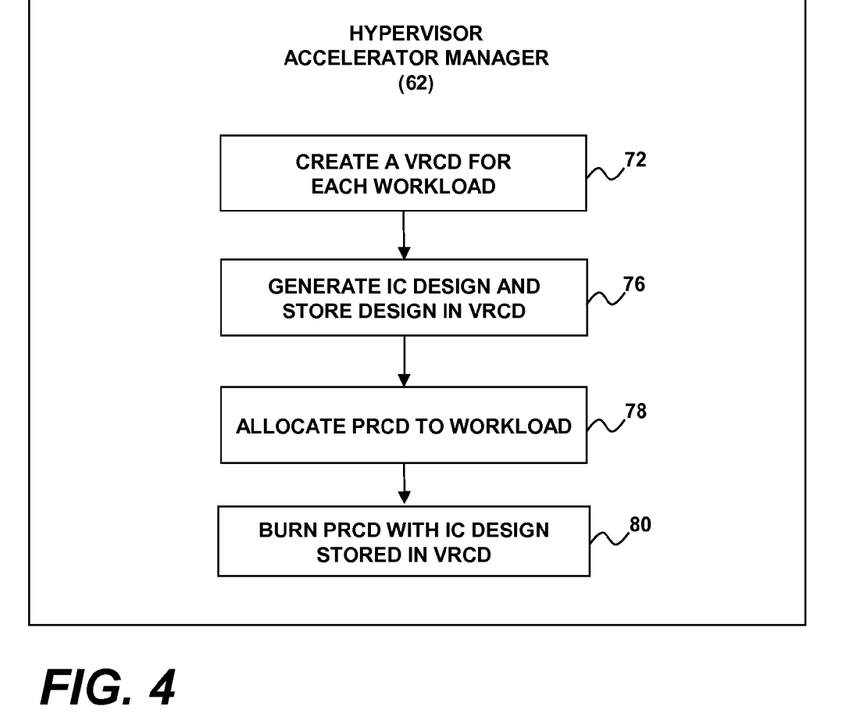
FIG. 4 is a flow diagram showing example operations of FIG. 3 that may be implemented by a hypervisor in the system of FIG. 1.
Figure 5:
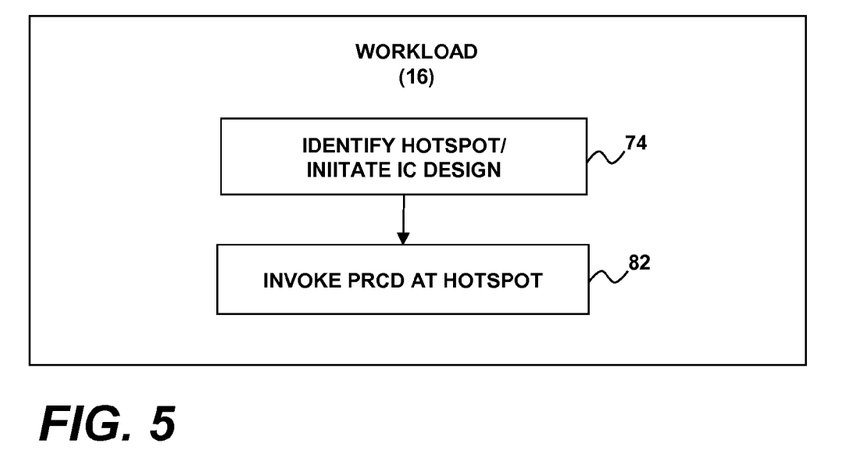
FIG. 5 is a flow diagram showing example operations of FIG. 3 that may be implemented by a workload in the system of FIG. 1.

As noted above, some of the operations depicted in FIG. 3 may be implemented by the hypervisor 12 while other operations may be implemented by the workload 16. FIGS. 4 and 5 illustrate operations of FIG. 3 that are respectively suited for each entity. As shown in FIG. 4, the hypervisor operations may include operational block 72 (create a VRCD for each workload), operational block 76 (generate IC design and store design in VRCD), operational block 78 (allocate PRCD to workload) and operational block 80 (burn PRCD with IC design stored in VRCD). As shown in FIG. 5, the workload operations may include operational block 74 (identify hotspot/initiate IC design) and operational block 82 (modify hotspot to invoke PRCD). Although not shown, it will be appreciated that one or more other entities may be involved in one or more of the operations of FIG. 3. For example, instead of the accelerator manager 62 directly performing IC design processing per operational block 76, it could do so indirectly by invoking a separate entity to perform some or all of the IC design work. Similarly, the accelerator manager 62 could either directly perform the PRCD burning of operational block 80, or it could do so indirectly through a separate entity.

Accordingly, a technique has been disclosed for sharing reconfigurable computing devices between workloads. It will be appreciated that the foregoing concepts may be variously embodied in any of a machine implemented method, a computing system, and a computer program product. Example embodiments of a machine-implemented method have been described in connection with FIGS. 3-5. An example embodiment of a computing system has been described in connection with FIGS. 1-2. With respect to a computer program product, digitally encoded program instructions may be stored on one or more data storage media for use in controlling a CPU or other instruction processing device to perform operations. The program instructions may be embodied as machine language code that is ready for loading and execution by the machine apparatus, or the program instructions may comprise a higher level language that can be compiled and/or interpreted and/or assembled into machine language. Example languages include, but are not limited to C, C++, Java, assembly, to name but a few. When implemented on a machine apparatus comprising a processor, the program instructions combine with the processor to provide a particular machine that operates analogously to specific logic circuits, which themselves could be used to implement the disclosed subject matter.

Figure 6:
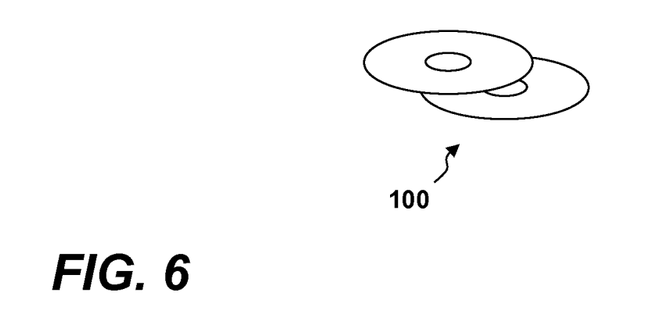
FIG. 6 is a diagrammatic illustrate of example data storage media that may be used to store program instructions for implementing the logic of FIG. 4, or the logic of FIG. 5 or 6.

Example computer-readable storage media for storing digitally encoded program instructions are shown by reference numerals 36 (memory) and 42 (storage device) of the apparatus 30 in FIG. 2. A further example of computer-readable storage media that may be used to store the program instructions is shown by reference numeral 100 in FIG. 6. The media 100 are illustrated as being portable optical storage disks of the type that are conventionally used for commercial software sales, such as compact disk-read only memory (CD-ROM) disks, compact disk-read/write (CD-R/W) disks, and digital versatile disks (DVDs). Such media can store the program instructions either alone or in conjunction with an operating system or other software product that incorporates the required functionality. The media could also be provided by portable magnetic or electrical storage media (such as floppy disks, USB flash devices, etc.). The storage media may also be combined with drive systems (e.g. disk drives), or incorporated in a computing system (e.g., as random access memory (RAM), read-only memory (ROM) or other semiconductor or solid state memory). More broadly, the media could comprise any electronic, magnetic, optical, magneto-optical, infrared, semiconductor system or apparatus or device, or any other tangible entity representing a machine, manufacture or composition of matter that can contain, store, communicate, or transport the program instructions for use by or in connection with an instruction execution system, apparatus or device, such as a computer. For all of the above forms of media, when the program instructions are loaded into and executed by a computing system, the resultant programmed system becomes a particular machine for practicing embodiments of the method(s) and system(s) described herein.

Although various embodiments of the invention have been described, it should be apparent that many variations and alternative embodiments could be implemented in accordance with the present disclosure. It is understood, therefore, that the invention is not to be in any way limited except in accordance with the spirit of the appended claims and their equivalents.

What is claimed is:

1. A hypervisor method for sharing one or more physical RCDs (PRCDs) between one or more workloads in one or more virtual computing environments supported by a system of sharable hardware resources that includes one or more CPUs, one or more data storage resources, and said one or more PRCDs, said hypervisor method comprising machine operations that include:
   (1) providing a virtual RCD (VRCD) for one of said workloads, said VRCD being programmed with an IC design representing a hardware implementation of a software hotspot in said workload;
   said programmed VRCD storing said IC design as a hardware implementation file that is native to said one or more PRCDs;
   said IC design comprising a device-independent register transfer level (RTL) representation of said hotspot that has been synthesized as said IC design;
   (2) allocating one of said PRCDs to said workload by scheduling said programmed VRCD on said PROD;
   said PRCDs being grouped into one or more PROD pools each having one or more VRCDs assigned to it, said programmed VRCD only being scheduled on PRCDs in a particular PROD pool to which it is assigned;
   said programmed VRCD being scheduled on one of said PRCDs on an exclusive basis if the number of VRCDs assigned to said particular PROD pool equals the number of PRCDs therein;
   said programmed VRCD being scheduled with one or more other programmed VRCDs on a shared basis on one of said PRCDs using a dynamic scheduling policy if the number of VRCDs assigned to said particular PROD pool is greater than the number of PRCDs therein; and
   (3) burning said PROD with said IC design of said programmed VRCD so that said PROD becomes a programmed PROD that is capable of implementing said workload's hotspot in hardware.

2. The hypervisor method of claim 1, wherein said operations further include programming said VRCD with said IC design.

3. A workload method for utilizing one or more physical RCDs (PRCDs) that are shared between one or more workloads in one or more virtual computing environments supported by a system of sharable hardware resources that includes one or more CPUs, one or more data storage resources, and said one or more PRCDs, said workload method comprising machine operations that include:
   (1) invoking a programmed virtual RCD (VRCD) instead of executing a hotspot in said workload as software in order to cause one of said PRCDs that has been programmed with an IC design representing a hardware implementation of one or more code-streams of said hotspot to implement said hotspot in hardware;
   said programmed VRCD storing said IC design as a hardware implementation file that is native to said one or more PRCDs;
   said IC design comprising a device-independent register transfer level (RTL) representation of said hotspot that has been synthesized as said IC design;
   one of said PRCDS having been allocated to said workload by scheduling said programmed VRCD on said PROD;
   said PRCDs being grouped into one or more PRCD pools each having one or more VRCDs assigned to it, said programmed VRCD only being scheduled on PRCDs in a particular PRCD pool to which it is assigned;
   said programmed VRCD being scheduled on one of said PRCDs on an exclusive basis if the number of VRCDs assigned to said particular PROD pool equals the number of PRCDs therein;
   said programmed VRCD being scheduled with one or more other programmed VRCDs on a shared basis on one of said PRCDs using a dynamic scheduling policy if the number of VRCDs assigned to said particular PROD pool is greater than the number of PRCDs therein; and
   said operations further including identifying said hotspot as a candidate for hardware implementation in one of said PRCDs, initiating IC design processing that will generate said IC design, and modifying said hotspot to invoke said programmed VRCD.

* * * * *